(12) United States Patent
Sato et al.

(10) Patent No.: US 10,921,606 B2
(45) Date of Patent: Feb. 16, 2021

(54) OPTICAL MULTIPLEXER

(71) Applicant: Mitsubishi Electric Corporation, Tokyo (JP)

(72) Inventors: Yoshiya Sato, Tokyo (JP); Tadashi Murao, Tokyo (JP); Keita Mochizuki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/615,271

(22) PCT Filed: May 26, 2017

(86) PCT No.: PCT/JP2017/019786
§ 371 (c)(1),
(2) Date: Nov. 20, 2019

(87) PCT Pub. No.: WO2018/216216
PCT Pub. Date: Nov. 29, 2018

(65) Prior Publication Data
US 2020/0088959 A1    Mar. 19, 2020

(51) Int. Cl.
*G02B 27/28* (2006.01)
*G02B 6/42* (2006.01)
(Continued)

(52) U.S. Cl.
CPC ............ *G02B 27/283* (2013.01); *G02B 6/27* (2013.01); *G02B 6/272* (2013.01); *G02B 6/2773* (2013.01);
(Continued)

(58) Field of Classification Search
None
See application file for complete search history.

(56) References Cited

U.S. PATENT DOCUMENTS 4,966,444 A * 10/1990 Droegemueller .... G02B 6/4204
359/641
5,359,689 A    10/1994 Iwatsuka et al.
(Continued)

FOREIGN PATENT DOCUMENTS

JP    5-53082 A    3/1993
JP    6-88926 A    3/1994
(Continued)

OTHER PUBLICATIONS

Notice of Reasons for Refusal for Japanese Application No. 2017-563357, dated Feb. 6, 2018.

*Primary Examiner* — Michael Stahl
(74) *Attorney, Agent, or Firm* — Birch, Stewart, Kolasch & Birch, LLP.

(57) ABSTRACT

An optical multiplexer includes a polarizer, a receptacle, a rotator disposed between the polarizer and the receptacle to rotate polarization planes of a pair of linearly polarized light beams in a forward direction and a polarization plane of a light beam in an opposite direction by 45 degrees, the forward direction being from the polarizer toward the receptacle, the opposite direction being from the receptacle to the polarizer, and a birefringent prism disposed between the rotator and the receptacle to multiplex the pair of linearly polarized light beams in the forward direction and to split the light beam in the opposite direction into an ordinary ray and an extraordinary ray. The rotator and the birefringent prism are fixed to the receptacle.

14 Claims, 5 Drawing Sheets

(51) Int. Cl.
   *G02B 6/27* (2006.01)
   *H01S 5/40* (2006.01)
   *G02B 6/38* (2006.01)

(52) U.S. Cl.
   CPC .......... *G02B 6/4208* (2013.01); *H01S 5/4012* (2013.01); *G02B 6/2746* (2013.01); *G02B 6/38* (2013.01)

(56) References Cited

U.S. PATENT DOCUMENTS

| | | | | |
|---|---|---|---|---|
| 5,689,359 A | * | 11/1997 | Kurata | G02B 6/272 |
| | | | | 359/281 |
| 7,081,996 B2 | * | 7/2006 | Wills | G02B 6/272 |
| | | | | 359/484.03 |
| 2004/0240767 A1 | * | 12/2004 | Kimura | H01S 5/02248 |
| | | | | 385/11 |
| 2009/0116838 A1 | | 5/2009 | Kihara | |
| 2015/0098127 A1 | * | 4/2015 | Kurokawa | H04B 10/50 |
| | | | | 359/484.03 |
| 2016/0047987 A1 | * | 2/2016 | Du | G02B 6/2773 |
| | | | | 359/484.05 |
| 2018/0156976 A1 | * | 6/2018 | Watanabe | G02F 1/093 |

FOREIGN PATENT DOCUMENTS

| | | | |
|---|---|---|---|
| JP | 6-138410 A | * | 5/1994 |
| JP | 9-145929 A | | 6/1997 |
| JP | 2002-250897 A | | 9/2002 |
| JP | 2007-101652 A | | 4/2007 |
| JP | 2008-90019 A | | 4/2008 |
| JP | 2011-118329 A | | 6/2011 |
| JP | 5495889 B2 | | 5/2014 |
| JP | 2014-186127 A | | 10/2014 |
| JP | 2015-1626 A | | 1/2015 |

* cited by examiner

OPTICAL MULTIPLEXER

FIELD

The present invention relates to an optical multiplexer having an isolator function.

BACKGROUND

An optical multiplexer is an optical component that multiplexes a plurality of light beams having different wavelength bands, and is used in an optical communication device or the like that uses wavelength multiplexing (WDM). An isolator is an optical device that allows light in one direction to pass therethrough and blocks light in an opposite direction. Providing an optical multiplexer with an isolator function makes it possible to prevent optical characteristics of a light source from deteriorating due to return of reflected light to the light source.

Patent Literature 1 discloses an optical multiplexer that has an isolator function. The optical multiplexer described in Patent Literature 1 includes a polarizer, a Faraday rotator, and a birefringent prism. The birefringent prism has a function of a multiplexer that multiplexes a plurality of polarized waves. The polarizer blocks reflected light, thereby achieving the isolator function.

CITATION LIST

Patent Literature

Patent Literature 1: Japanese Patent Application Laid-open. No. 2007-101652

SUMMARY

Technical Problem

However, the optical device disclosed in Patent Literature 1 poses a problem of the size in a traveling direction of light being large.

The present invention has been achieved in view of the above problem, and an object of the present invention is to provide an optical multiplexer that has an isolator function and can suppress the size in a traveling direction of light.

Solution to Problem

In order to solve the above problems and achieve the object, an optical multiplexer according to the present invention comprises: a polarizer; a receptacle; a rotator disposed between the polarizer and the receptacle to rotate polarization planes of a pair of linearly polarized light beams in a forward direction and a polarization plane of a light beam in an opposite direction by 45 degrees, the forward direction being from the polarizer toward the receptacle, the opposite direction being from the receptacle to the polarizer; and a birefringent prism disposed between the rotator and the receptacle to multiplex the pair of linearly polarized light beams in the forward direction and to split the light beam in the opposite direction into an ordinary ray and an extraordinary ray. The rotator and the birefringent prism are fixed to the receptacle.

Advantageous Effects of Invention

According to the present invention, there is an effect where it is possible to provide an optical multiplexer that has an isolator function and can suppress the size in a traveling direction of light.

DESCRIPTION OF EMBODIMENTS

An optical multiplexer according to embodiments of the present invention will be described in detail below with reference to the accompanying drawings. The present invention is not limited to the embodiments.

First Embodiment

Figure 1:
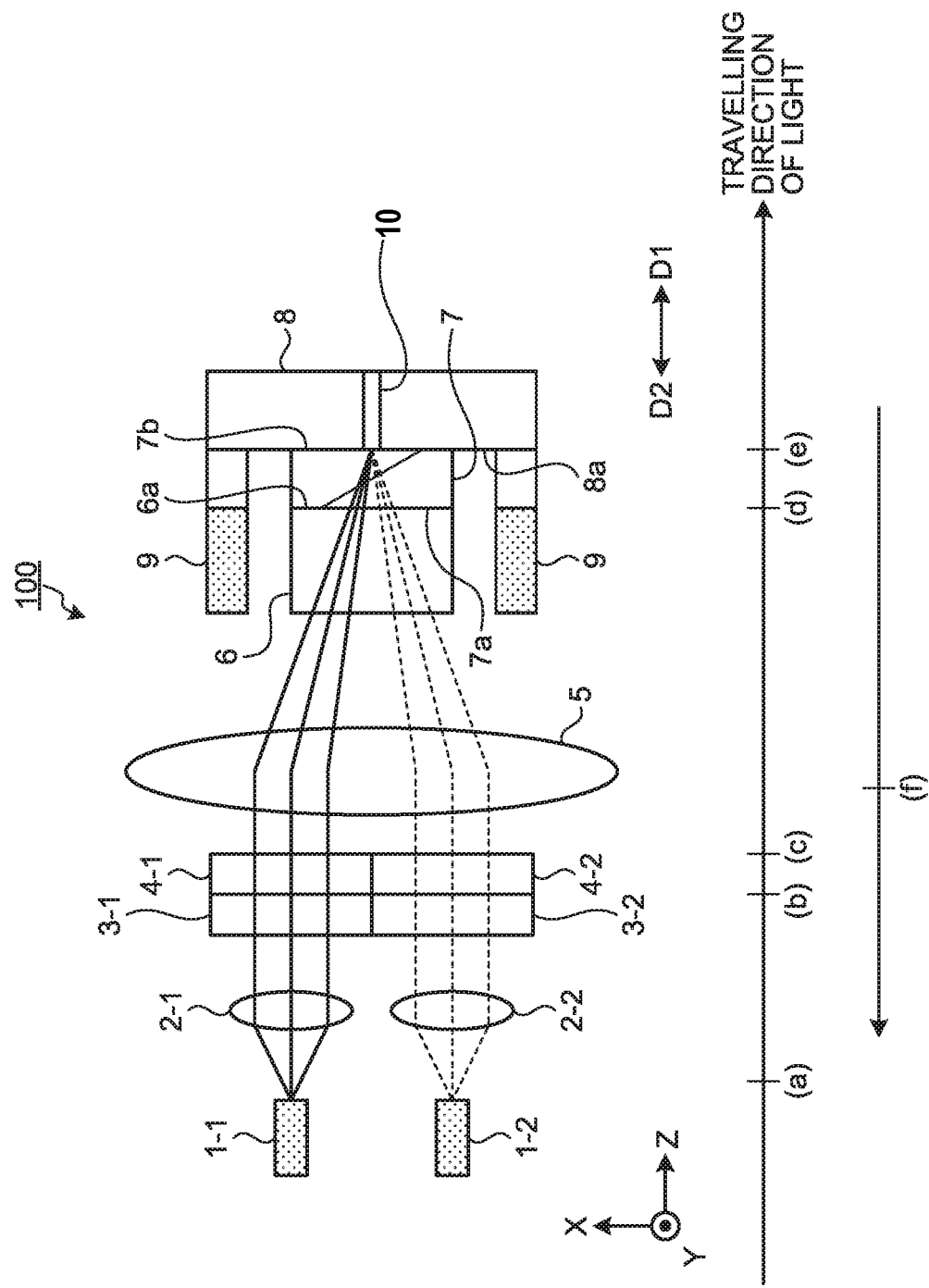
FIG. 1 is a diagram illustrating a configuration of an optical multiplexer according to a first embodiment of the present invention.

FIG. 1 is a diagram illustrating a configuration of an optical multiplexer 100 according to a first embodiment of the present invention. The optical multiplexer 100 includes a pair of light sources 1-1 and 1-2, a pair of collimator lenses 2-1 and 2-2, a pair of half-wave plates 3-1 and 3-2, a pair of polarizers 4-1 and 4-2, a condenser lens 5, a rotator 6, a birefringent prism 7, a receptacle 8, and magnets 9. The elements of the optical multiplexer 100 are arranged in the order described above.

The collimator lens 2-1, the half-wave plate 3-1, and the polarizer 4-1 are arranged on an optical path of a light beam L1 emitted from the light source 1-1. The collimator lens 2-2, the half-wave plate 3-2, and the polarizer 4-2 are arranged on an optical path of a light beam 12 emitted from the light source 1-2. The condenser lens 5, the rotator 6, and the birefringent prism 7 are arranged extending across the optical path of the light beam L1 and the optical path of the light beam L2.

As illustrated in FIG. 1, a traveling direction of light beams emitted from the light sources 1-1 and 1-2 is defined as a Z-axis direction, a direction in which the light sources 1-1 and 1-2 are arranged and which is perpendicular to the Z-axis direction is defined as an X-axis axis direction, and a direction perpendicular to the X-axis direction and the Z-axis direction is defined as a Y-axis direction. Further, a traveling direction of the light beams emitted from the light sources 1-1 and 1-2 toward the receptacle 8 is referred to as "forward direction D1". A direction from the receptacle 8 toward the light sources 1-1 and 1-2, which is opposite to the forward direction D1, is referred to as "opposite direction D2".

Each of the light sources 1-1 and 1-2 is a semiconductor laser (LD: Laser Diode) and emits a linearly polarized light beam. The collimator lenses 2-1 and 2-2 individually collimate light incident thereon. The linearly polarized light beam emitted from the light source 1-1 is incident on the collimator lens 2-1, and the linearly polarized light beam emitted from the light source 1-2 is incident on the collimator lens 2-2.

The half-wave plates 3-1 and 3-2 are birefringent elements that generate a phase difference of 180 degrees between mutually orthogonal polarized components. Linearly polarized light beams that have passed through the half-wave plates 3-1 and 3-2 change in their polarization directions. A polarization direction is a direction of vibration of an electric field vector, and linearly polarized light has a constant polarization direction. Polarization axes of the half-wave plates 3-1 and 3-2 are different from each other by 45 degrees. A polarization axis is an axis on which a polarization direction of emitted linearly polarized light and an orientation thereof are coincident with each other.

Each of the polarizers 4-1 and 4-2 generates linearly polarized light having a predetermined polarization direction. Polarization axes of the polarizers 4-1 and 4-2 are orthogonal to each other. The polarization axis of each of the polarizers 4-1 and 4-2 is a polarization direction of linearly polarized light that can pass therethrough. Light that has passed through the half-wave plate 3-1 is incident on the polarizer 4-1, and light that has passed through the half-wave plate 3-2 is incident on the polarizer 4-2.

In the present embodiment, light beams are incident on the polarizers 4-1 and 4-2 from the half-wave plate 3-1 or 3-2, respectively. Therefore, each of the polarizers 4-1 and 4-2 has the polarization axis oriented to allow the light beam emitted from the corresponding half-wave plate 3-1 or 3-2 to pass therethrough.

The condenser lens 5 is disposed between the polarizers 4-1 and 4-2 and the rotator 6, and converges, to the receptacle 8, light beams in the forward direction D1 from the polarizers 4-1 and 4-2. The rotator 6 is disposed between the polarizers 4-1 and 4-2 and the receptacle 8 and between the condenser lens 5 and the birefringent prism 7. The rotator 6 rotates the polarization state of light incident thereon by a magnetic field generated by the two magnets 9 disposed with the rotator 6 interposed therebetween, thereby rotating a polarization plane of linearly polarized light incident thereon. Here, a polarization plane is a plane containing a polarization direction and a traveling direction of light. As viewed from the same direction, the rotating direction of the polarization plane in the forward direction D1 and that in the opposite direction D2 are the same as each other.

The birefringent prism 7 is disposed between the rotator 6 and the receptacle 8. The birefringent prism 7 multiplexes two incident light beams travelling in the forward direction D1. The birefringent prism 7 splits the incident light beam travelling in the opposite direction D2, into two light beams that have polarization planes different from each other by 90 degrees and have the same intensity. The two light beams separated from each other are referred to as "ordinary ray" and "extraordinary ray", respectively. Two linearly polarized light beams in the forward direction D1 are incident on the birefringent prism 7 from the rotator 6 with optical paths and polarization directions thereof matching those of the ordinary ray and the extraordinary ray. That is, the polarization direction of light incident in the forward direction D1 with its optical path matching the optical path of the ordinary ray is the same as the polarization direction of the ordinary ray from which light in the opposite direction D2 is split. Also, the polarization direction of light incident in the forward direction D1 with its optical path matching the optical path of the extraordinary ray is the same as the polarization direction of the extraordinary ray in the opposite direction D2. Allowing a pair of linearly polarized light beams satisfying the above condition to be incident on the birefringent prism 7 in the forward direction D1 multiplexes the pair of linearly polarized light beams. Therefore, two directions that are coincident with the optical paths of the ordinary ray and the extraordinary ray can be regarded as directions of crystalline optic axes on which light incident in the forward direction D1 is not split. Therefore, it can be also said that the pair of linearly polarized light beams are incident on the birefringent prism 7 in the forward direction D1 at angles of incidence matching directions of crystalline optic axes of the birefringent prism 7.

The birefringent prism 7 is a Wollaston prism in which two birefringent materials are bonded to each other. The two birefringent materials are fixed with their crystalline optic axes arranged perpendicularly to each other. A polarization splitting angle of the birefringent prism 7 is equal to or larger than 10 degrees.

The receptacle 8 is an optical module component that incorporates therein an optical fiber stub and has a function of connecting to an optical connector. The rotator 6, the birefringent prism 7, and the magnets 9 are fixed to the receptacle 8. The rotator 6, the birefringent prism 7, and the magnets 9 are fixed to the receptacle 8 by bonding, for example. One surface 6a of the rotator 6 from which light in the forward direction D1 exits and a surface 7a of the birefringent prism 7 on which the light in the forward direction D1 is incident are bonded to each other. One surface 7b of the birefringent prism 7 from which the light in the forward direction D1 exits and a surface 8a of the receptacle 8 on which the light in the forward direction D1 is incident are bonded to each other. The receptacle 8 has a ferrule 10 that is connectable to a tapered fiber having its end having a widened diameter.

The plurality of elements illustrated in FIG. 1 may be all enclosed in a case (not illustrated) to form a module. For example, the optical multiplexer 100 is an optical module called a TSA (Transmitter Optical SubAssembly), and an optical axis thereof is adjusted in such a manner that just inserting an optical fiber to the optical multiplexer 100 makes the optical multiplexer 100 usable.

Figure 2:
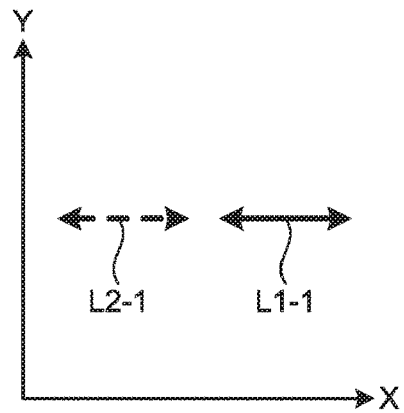
FIG. 2 is a diagram illustrating a polarization direction of light at position (a) in FIG. 1.
Figure 3:
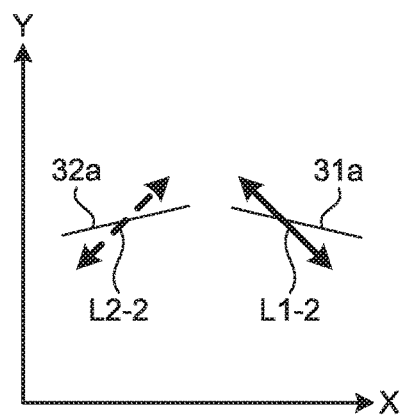
FIG. 3 is a diagram illustrating a polarization direction of light at position (b) in FIG. 1.
Figure 4:
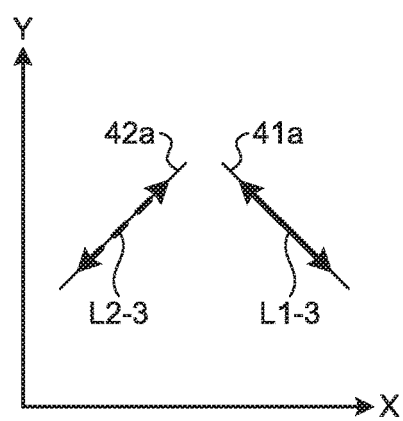
FIG. 4 is a diagram illustrating a polarization direction of light at position (c) in FIG. 1.
Figure 5:
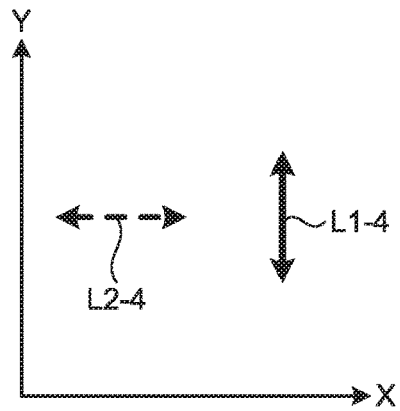
FIG. 5 is a diagram illustrating a polarization direction of light at position (d) in FIG. 1.
Figure 6:
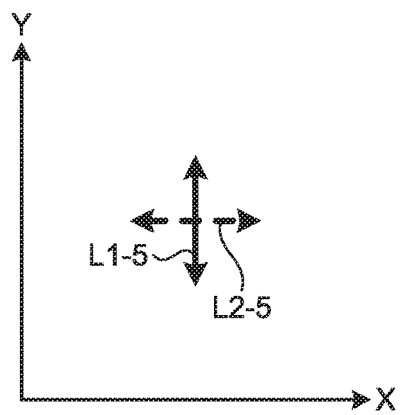
FIG. 6 is a diagram illustrating a polarization direction of light at position (e) in FIG. 1.
Figure 7:
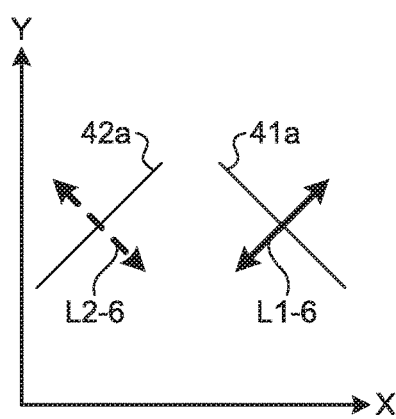
FIG. 7 is a diagram illustrating a polarization direction of light at position (f) in FIG. 1.

FIGS. 2 to 7 illustrate a transition of a polarization direction of light at each portion of the optical multiplexer 100 illustrated in FIG. 1. FIG. 2 is a diagram illustrating a polarization direction of light at position (a) in FIG. 1. FIG. 3 is a diagram illustrating a polarization direction of light at position (b) in FIG. 1. FIG. 4 is a diagram illustrating a polarization direction of light at position (c) in FIG. 1. FIG. 5 is a diagram illustrating a polarization direction of light at position (d) in FIG. 1. FIG. 6 is a diagram illustrating a polarization direction of light at position (e) in FIG. 1. FIG. 7 is a diagram illustrating a polarization direction of light at position (f) in FIG. 1.

A light beam L1-1 and a light beam L2-1 at position (a) in FIG. 1 are linearly polarized light beams having a horizontal polarization direction as illustrated in FIG. 2. The light beam L1 is collimated by the collimator lens 2-1 into a collimated light beam, and the collimated light is incident on the half-wave plate 3-1. The light beam L2 is collimated by the collimator lens 2-2 into a collimated light beam, and the collimated light is incident on the half-wave plate 3-2. A light beam L1-2 and a light beam L2-2 at position (b) in FIG. 1 become ±45-degree linearly polarized light beams as illustrated in FIG. 3. Polarization axes 31a and 32a of the half-wave plates 3-1 and 3-2 are ±22.5 degrees.

The direction of a polarization axis 41a of the polarizer 4-1 is −45 degrees, and the direction of a polarization axis 42a of the polarizer 4-2 is +45 degrees. At position (c) in FIG. 1, a polarization direction of a light beam L1-3 is −45 degrees and a polarization direction of a light beam L2-3 is +45 degrees, as illustrated in FIG. 4. Therefore, the light beams L1 and L2 incident from the polarizers 4-1 and 4-2 on the condenser lens 5 are +45-degree linearly polarized light beams.

The light beams L1 and L2 are converged by the condenser lens 5 and are then incident on the rotator 6. While linearly polarized light passes through the rotator 6, a polarization plane thereof is rotated by 45 degrees. Therefore, a polarization direction of a light beam L1-4 at position (d) in FIG. 1 becomes a vertical direction, as illustrated in FIG. 5. A polarization direction of a light beam L2-4 at position (d) in FIG. 1 becomes a horizontal direction, as illustrated in FIG. 5. The light beams L1 and L2 having passed through the rotator 6 in the forward direction D1 are incident on the birefringent prism 7 at different angles from each other. At position (e) in FIG. 1, light beams L1-5 and L2-5 that have passed through the birefringent prism 7 in the forward direction D1 are multiplexed into one optical path as illustrated in FIG. 6. Multiplexed light is emitted from an exit of the receptacle 8.

Light in the opposite direction D2 which has been reflected by the receptacle 8 is split into an ordinary ray and an extraordinary ray by the birefringent prism 7. When the ordinary ray and the extraordinary ray that have been separated from each other pass through the rotator 6, a polarization plane of linearly polarized light is rotated by 45 degrees. As viewed from the same direction, a rotating direction of the polarization plane in the rotator 6 is the same between incident light in the forward direction D1 and incident light in the opposite direction D2. The ordinary ray and the extraordinary ray having passed through the rotator 6 are incident on the condenser lens 5 in the opposite direction D2 after following an optical path on which the light beam in the forward direction D1 is incident from the condenser lens 5 on the rotator 6. Then, these rays are incident on the polarizers 4-1 and 4-2 as collimated light beams, respectively. At position (f) in FIG. 1, a light beam L1-6 incident on the polarizer 4-1 in the opposite direction D2 is perpendicular to the direction of the polarization axis 41a of the polarizer 4-1, and a light beam L2-6 incident on the polarizer 4-2 in the opposite direction D2 is perpendicular to the direction of the polarization axis 42a of the polarizer 4-2, as illustrated in FIG. 7. Therefore, the polarizers 4-1 and 4-2 have a function of an isolator that allows light in the forward direction D1 to pass therethrough and blocks light in the opposite direction D2.

The transitions of the polarization direction illustrated in FIGS. 2 to 7 are typical examples, and the transitions of the polarization direction are not limited to the examples illustrated in FIGS. 2 to 7. The order of transitions of the polarization direction may be different, and the polarization direction may be different as long as the function of the optical multiplexer 100 can be achieved. Further, although the optical multiplexer 100 includes the pair of half-wave plates 3-1 and 3-2 in the first embodiment described above, the present invention is not limited thereto. In a case where a polarization axis of one of the half-wave plates 3 inclines at an angle of 45 degrees relative to a polarization direction of polarized light in the optical multiplexer 100, it is possible to omit the other half-wave plate 3.

As described above, the optical multiplexer 100 according to the first embodiment of the present invention has a function of multiplexing light beams emitted from the two light sources 1-1 and 1-2 and emitting a multiplexed light beam and also has a function of an isolator that blocks a light beam that has been reflected and travels in the opposite direction D2. Because a polarization plane of light incident on the rotator 6 is rotated through 45 degrees by the rotator 6, when light traveling in the forward direction D1 is reflected, then travels in the opposite direction D2, and passes through the rotator 6, the polarization plane is rotated through 90 degrees in a round trip. Therefore, light beams that have passed through the polarizers 4-1 and 4-2 in the forward direction D1 are blocked failing to pass through the polarizers 4-1 and 4-2 in the opposite direction D2. Because the rotator 6 and the birefringent prism 7 are fixed to the receptacle 8, it is possible to achieve a more compact optical multiplexer than an optical multiplexer that uses a mirror and a bandpass filter or a polarizing filter, an optical multiplexer that uses a PLC (Planar Lightwave Circuit)-AWG (Arrayed-Waveguide Grating), and the like.

Further, in the optical multiplexer 100 according to the present first embodiment, two collimated light beams are converged by the condenser lens 5 to be incident on an incident surface of the rotator 6 at different angles from each other. Therefore, when the same length of the optical path is obtained, it is possible to reduce a distance in a direction perpendicular to the incident surface of the rotator 6 than in a case where collimated light perpendicular to the incident surface of the rotator 6 is incident on the rotator 6. Accordingly, it is possible to downsize the optical multiplexer 100 in a traveling direction of light.

Furthermore, the birefringent prism 7 of the optical multiplexer 100 according to the present first embodiment is a Wollaston prism in which two types of birefringent materials are bonded to each other. Therefore, as compared with a case of using a single birefringent material, it is possible to make a polarization splitting angle larger and to split polarization light substantially symmetrically.

Second Embodiment

Figure 8:
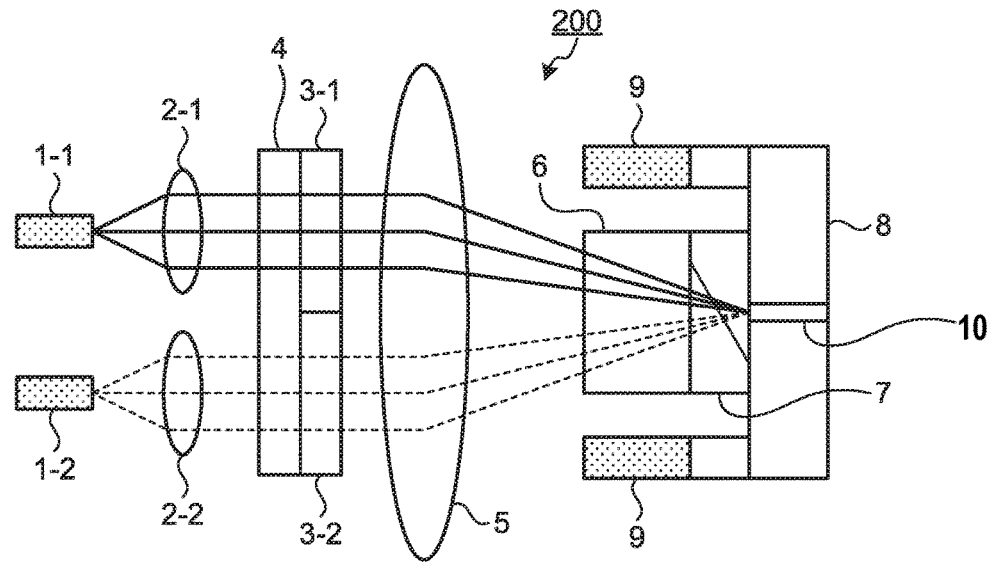
FIG. 8 is a diagram illustrating a configuration of an optical multiplexer according to a second embodiment of the present invention.

FIG. 8 is a diagram illustrating a configuration of an optical multiplexer 200 according to a second embodiment of the present invention. The optical multiplexer 200 is different from the optical multiplexer 100 in that the positions of the half-wave plates 3 and the polarizer 4 are switched over and an integrated polarizer 4 is used in place of the pair of polarizers 4-1 and 4-2. Both a light beam having been emitted from the light source 1-1 and passed through the collimator lens 2-1, and a light beam having been emitted from the light source 1-2 and passed through the collimator lens 2-2 are incident on the polarizer 4. Therefore, if a polarization direction of the light beam emitted from the light source 1-1 and a polarization direction of the light beam emitted from the light source 1-2 match each other, the integrated type polarizer 4 can be used.

Although the optical multiplexer 200 includes the two half-wave plates 3-1 and 3-2 in the example of FIG. 8, either one of the plates 3-1 and 3-2 can be omitted as in the first embodiment. According to the second embodiment, because the number of the polarizer 4 is one, the configuration is simple and the cost of the optical multiplexer 200 can be reduced.

Third Embodiment

Figure 9:
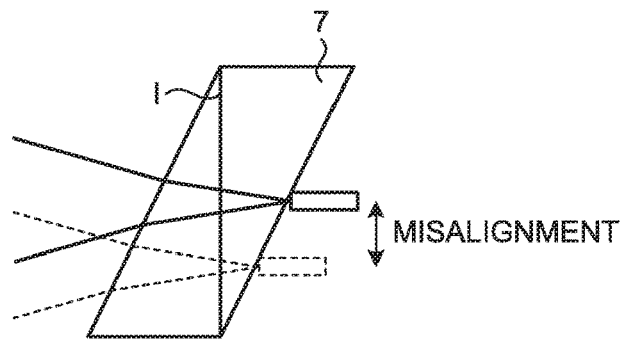
FIG. 9 is a diagram illustrating a configuration of a birefringent prism according to a third embodiment of the present invention.

FIG. 9 is a diagram illustrating a configuration of the birefringent prism 7 according to a third embodiment of the present invention. The birefringent prism 7 illustrated in FIG. 9 is a Wollaston prism in which two types of birefringent materials are bonded to each other, and the configuration illustrated in FIG. 9 may be applied to the optical multiplexer 100 illustrated in FIG. 1 and the optical multiplexer 200 illustrated in FIG. 8.

The birefringent prism 7 according to the third embodiment is designed in such a manner that a bonding surface I at which the birefringent materials are bonded to each other is at an angle of 90 plus or minus up to 10 degrees, with respect to a perpendicular line to the center line of two optical paths of light beams incident on the birefringent prism 7.

Figure 10:
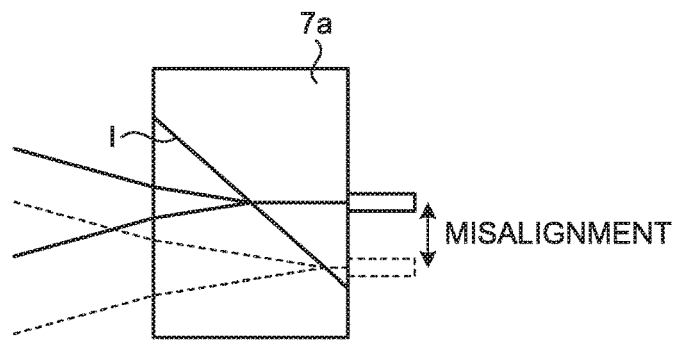
FIG. 10 is a diagram illustrating a configuration of a birefringent prism according to a comparative example.
Figure 11:
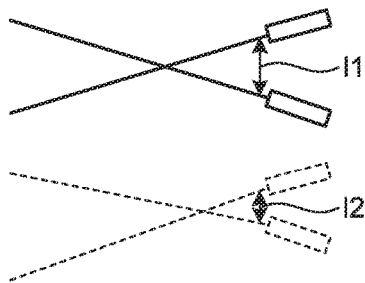
FIG. 11 is a diagram illustrating a change of an interval between polarized light beams at the birefringent prism illustrated in FIG. 10.
Figure 12:
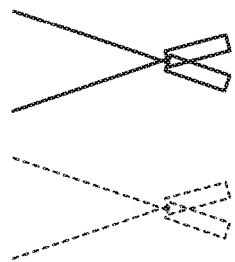
FIG. 12 is a diagram illustrating a change of an interval between polarized light beams at the birefringent prism illustrated in FIG. 9.

FIG. 10 is a diagram illustrating a configuration of a birefringent prism 7A according to a comparative example. In the birefringent prism 7A illustrated in FIG. 10, the bonding surface I inclines with respect to a center line of two optical paths. In general, light incident on the birefringent prism 7A is refracted at: a surface of the birefringent prism 7A on which the light is incident; and the bonding surface I. In a case where the bonding surface I inclines with respect to the center line of the two optical paths as in the comparative example illustrated in FIG. 10, when the positions of the receptacle 8 and the birefringent prism 7A are displaced relative to each other, an interval between two polarized light beams at the position of the receptacle 8 is changed from 11 to 12 as illustrated in FIG. 11 because of the refraction at the bonding surface I. FIG. 11 is a diagram illustrating a change of an interval between polarized light beams at the birefringent prism 7A illustrated in FIG. 10. Meanwhile, in a case where the bonding surface I is perpendicular to the center line of the two optical paths as illustrated in FIG. 9, the refraction at the bonding surface I is small. Therefore, the interval between the two polarized light beams at the position of the receptacle 8 is hardly changed as illustrated in FIG. 12. FIG. 12 is a diagram illustrating a change of an interval between polarized light beams at the birefringent prism 7 illustrated in FIG. 9. Accordingly, even when misalignment between the birefringent prism 7 and the receptacle 8 occurs, misalignment between optic axes is negligibly small and therefore reduction of a multiplexing efficiency can be suppressed.

As described above, the birefringent prism 7 is a Wollaston prism in which two types of birefringent materials are bonded to each other, and the bonding surface I at which the birefringent materials are bonded to each other is disposed perpendicularly to a center line of two optical paths of light beams incident on the birefringent prism 7. As a result, the two light beams incident on the birefringent prism 7, which are hardly refracted at the bonding surface I, travel straight and are multiplexed in the receptacle 8. Therefore, even if misalignment between the birefringent prism 7 and the receptacle 8 occurs, it is possible to suppress misalignment between optic axes, so that reduction of a multiplexing efficiency can be suppressed.

Fourth Embodiment

Figure 13:
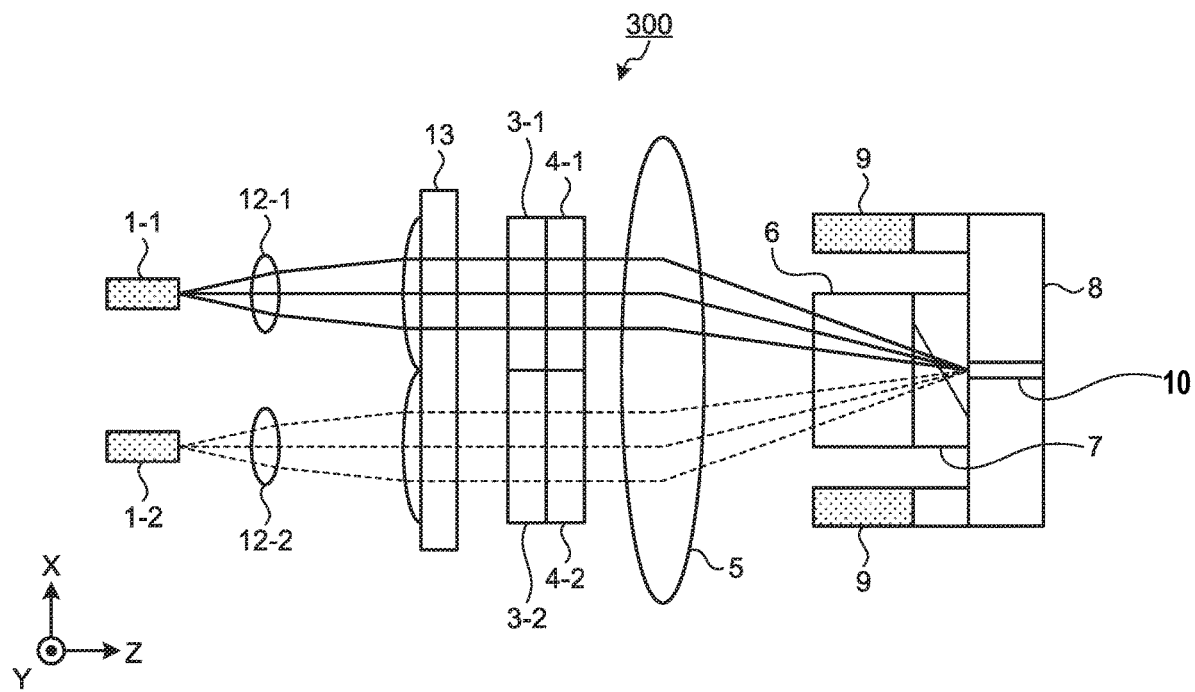
FIG. 13 is a diagram illustrating a configuration of an optical multiplexer according to a fourth embodiment of the present invention.

FIG. 13 is a diagram illustrating a configuration of an optical multiplexer 300 according to a fourth embodiment of the present invention. The optical multiplexer 300 includes a microlens array 13 in place of the collimator lenses 2-1 and 2-2, and has alignment lenses 12-1 and 12-2 arranged between the microlens array 13 and the light sources 1-1 and 1-2.

It is necessary to align and bond the collimator lenses 2-1 and 2-2 as illustrated in FIGS. 1 and 8 independently of each other in accordance with the positional displacement of the light sources 1-1 and 1-2, and the outer diameter sizes and the effective diameters of the collimator lenses 2-1 and 2-2 become small in order to ensure an alignment margin and a bonding margin. Further, because of a limit imposed on a polarization splitting angle in the birefringent prism 7, optical paths of two light beams to be multiplexed are approximated to each other within an approximately the same distance as a beam diameter. Therefore, it is likely that the light beams are out of range of the effective diameters of the collimator lenses 2-1 and 2-2, which leads to optical loss.

Meanwhile, by providing the alignment lenses 12-1 and 12-2 each having a small effective diameter and the microlens array 13 that functions as a collimator lens and obtains an effective diameter approximately as large as an optical pitch, it is possible to form collimated beams approximated to each other while maintaining an aligning property, so that a polarization splitting angle of the birefringent prism 7 can be minimized.

The light sources 1-1 and 1-2 may be integrated semiconductor lasers. An MMI (Multi-Mode Interference) type multiplexer, a multiplexer that uses a Mach-Zehnder interferometer, or the like is integrated in an integrated semiconductor laser.

Each component of the optical multiplexers 100, 200, and 300 described in the first to fourth embodiments described above is desirably enclosed in a case made of ceramic, resin, or metal. In this case, advantageous effects are obtained in which high airtightness and high shock absorption are ensured and the optical multiplexer is easy to carry and can be easily connected to a transceiver.

The configurations described in the above embodiments are only examples of the content of the present invention. The configurations can be combined with other well-known techniques, and part of each of the configurations can be omitted or modified without departing from the scope of the present invention.

For example, a birefringent prism is a Wollaston prism in each embodiment described above. However, the present invention is not limited thereto. The birefringent prism may be a single birefringent crystal, such as rutile and calcite.

Further, the condenser lens 5 is used to converge light in the forward direction D1 to the receptacle 8 in each embodiment described above. However, the present invention is not limited thereto. For example, it is possible to omit the condenser lens 5 to thereby allow collimated light to be incident on the rotator 6 and the birefringent prism 7.

However, use of the condenser lens 5 enables the size in the traveling direction of light to be suppressed.

REFERENCE SIGNS LIST

1-1, 1-2 light source, 2-1, 2-2 collimator lens, 3-1, 3-2 half-wave plate, 4, 4-1, 4-2 polarizer, 5 condenser lens, 6 rotator, 7, 7A birefringent prism, receptacle, 9 magnet, 12-1, 12-2 alignment lens, 13 microlens array, 100, 200, 300 optical multiplexer, D1 forward direction, D2 opposite direction, I bonding surface.

The invention claimed is:

1. An optical multiplexer comprising:
   a polarizer;
   a receptacle;
   a rotator disposed between the polarizer and the receptacle to rotate polarization planes of a pair of linearly polarized light beams in a forward direction and a polarization plane of a light beam in an opposite direction by 45 degrees, the forward direction being from the polarizer toward the receptacle, the opposite direction being from the receptacle to the polarizer;
   a condenser lens disposed between the polarizer and the rotator to converge the light beams in the forward direction from the polarizer, to the receptacle; and
   a birefringent prism disposed between the rotator and the receptacle to multiplex the pair of linearly polarized light beams in the forward direction and to split the light beam in the opposite direction into an ordinary ray and an extraordinary ray, wherein
   a polarization splitting angle of the birefringent prism is equal to or larger than 10 degrees,
   the rotator and the birefringent prism are fixed to the receptacle, a surface of the birefringent prism directly contacting a ferrule of the receptacle.

2. The optical multiplexer according to claim 1, wherein a pair of the linearly polarized light beams in the forward direction are incident on the birefringent prism with an optical path of one of the linearly polarized light beams and an optical path of the other linearly polarized light beam matching an optical path of the ordinary ray and an optical path of the extraordinary ray, respectively.

3. The optical multiplexer according to claim 1, wherein the birefringent prism is a Wollaston prism.

4. The optical multiplexer according to claim 3, wherein the Wollaston prism is configured by two birefringent materials bonded to each other, and the Wollaston prism is arranged in such a manner that a bonding surface of the two birefringent materials is perpendicular to a center line of optical paths of two light beams incident on the Wollaston prism.

5. The optical multiplexer according to claim 1, further comprising either a pair of half-wave plates or a single half-wave plate, the pair of half-wave plates having polarization axes different from each other by 45 degrees, the pair of half-wave plates being provided on different optical paths from each other, the single half-wave plate changing a polarization direction by 90 degrees on one of two optical paths.

6. The optical multiplexer according to claim 5, wherein the half-wave plate is disposed between the polarizer and the rotator, and
the polarizer extends across the two optical paths.

7. The optical multiplexer according to claim 5, wherein a pair of the polarizers is disposed between the half-wave plate and the rotator, and
the polarizers each have a polarization axis along a polarization direction of light emitted from the half-wave plate.

8. The optical multiplexer according to claim 7, wherein the pair of the polarizers have polarization axes perpendicular to each other.

9. The optical multiplexer according to claim 1, further comprising:
   two light sources; and
   a collimator lens to collimate light beams from the light sources.

10. The optical multiplexer according to claim 9, wherein the collimator lens is a microlens array extending across optical paths of two light beams from the two light sources.

11. The optical multiplexer according to claim 10, further comprising an optical-axis correcting lens disposed between the light sources and the microlens array.

12. The optical multiplexer according to claim 1, further comprising a case in which the polarizer, the rotator, the birefringent prism, and the receptacle are enclosed.

13. The optical multiplexer according to claim 1, wherein the receptacle includes a ferrule connectable to a tapered fiber.

14. The optical multiplexer according to claim 9, wherein the two light sources are integrated semiconductor lasers.

* * * * *